US010833267B2

(12) United States Patent
Ok et al.

(10) Patent No.: US 10,833,267 B2
(45) Date of Patent: Nov. 10, 2020

(54) STRUCTURE AND METHOD TO FORM PHASE CHANGE MEMORY CELL WITH SELF-ALIGN TOP ELECTRODE CONTACT (71) Applicant: International Business Machines Corporation, Armonk, NY (US)

(72) Inventors: Injo Ok, Loudonville, NY (US); Myung-Hee Na, Lagrangeville, NY (US); Nicole Saulnier, Slingerlands, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 16/172,643

(22) Filed: Oct. 26, 2018

(65) Prior Publication Data

US 2020/0136043 A1  Apr. 30, 2020

(51) Int. Cl.
*H01L 45/00* (2006.01)
*H01L 27/24* (2006.01)

(52) U.S. Cl.
CPC ...... *H01L 45/1675* (2013.01); *H01L 27/2463* (2013.01); *H01L 45/06* (2013.01); *H01L 45/1253* (2013.01); *H01L 45/145* (2013.01)

(58) Field of Classification Search
None
See application file for complete search history.

(56) References Cited

U.S. PATENT DOCUMENTS

| | | | |
|---|---|---|---|
| 7,495,946 B2 | 2/2009 | Gruening-von Schwerin et al. | |
| 7,619,237 B2 | 11/2009 | Lung | |
| 7,642,125 B2 | 1/2010 | Lung et al. | |
| 7,777,212 B2* | 8/2010 | An | G11C 13/0004 257/2 |
| 8,030,635 B2* | 10/2011 | Lung | G11C 13/0004 257/2 |
| 8,445,313 B2* | 5/2013 | Breitwisch | H01L 45/06 257/2 |
| 9,245,789 B2* | 1/2016 | Okamoto | H01L 21/31116 |
| 2007/0173019 A1* | 7/2007 | Ho | H01L 27/24 438/257 |
| 2007/0252127 A1* | 11/2007 | Arnold | H01L 45/144 257/2 |
| 2008/0179584 A1* | 7/2008 | Lung | H01L 45/06 257/4 |
| 2009/0045388 A1* | 2/2009 | Clevenger | H01L 45/1206 257/4 |
| 2009/0101883 A1* | 4/2009 | Lai | H01L 45/06 257/3 |

(Continued)

FOREIGN PATENT DOCUMENTS

EP  2325911 B1  8/2015

OTHER PUBLICATIONS

Wong et al., "Phase Change Memory," Proceedings if the Institute of Electrical and Electronics Engineers, vol. 98, No. 12, Dec. 2010, pp. 2201-2227.

*Primary Examiner* — Andres Munoz
(74) *Attorney, Agent, or Firm* — Yee & Associates, P.C.

(57) ABSTRACT

A self-align metal contact for a phase control memory (PCM) element is provided that mitigates unwanted residual tantalum nitride (TaN) particles that would otherwise remain after patterning a TaN surface using an RIE process.

10 Claims, 11 Drawing Sheets

(56) References Cited

U.S. PATENT DOCUMENTS

| | | | |
|---|---|---|---|
| 2009/0239334 A1* | 9/2009 | Breitwisch | H01L 45/148 438/102 |
| 2010/0078621 A1* | 4/2010 | Breitwisch | H01L 45/144 257/4 |
| 2010/0297848 A1* | 11/2010 | Breitwisch | H01L 45/1683 438/703 |
| 2011/0155993 A1 | 6/2011 | Chen | |
| 2011/0300685 A1* | 12/2011 | Horii | H01L 45/1691 438/382 |
| 2012/0037877 A1* | 2/2012 | Breitwisch | H01L 45/1691 257/3 |
| 2012/0168957 A1* | 7/2012 | Srivastava | H01L 21/31144 257/774 |
| 2017/0222141 A1* | 8/2017 | BrightSky | H01L 45/06 |
| 2020/0066337 A1* | 2/2020 | Ok | H01L 45/1625 |

* cited by examiner

STRUCTURE AND METHOD TO FORM PHASE CHANGE MEMORY CELL WITH SELF- ALIGN TOP ELECTRODE CONTACT

BACKGROUND

1. Field

The disclosure relates generally to integrated circuit devices and associated fabrication techniques, and more specifically to a phase change memory device and associated fabrication of such phase change memory device.

2. Description of the Related Art

Resistive memory is a type of non-volatile memory that utilizes the resistance value of a memory element to store one or more bits of data. For example, a memory element programmed to have a high resistance value may represent a logical '1' data bit value, whereas a memory element programmed to have a low resistance value may represent a logical '0' data bit value. A voltage pulse or a current pulse is applied to the memory element in order to electrically switch the resistance value of the memory element.

Phase change materials that exhibit at least two states are used in phase change memory cells to store bits of data, where the states of the phase change material are sometimes referred to as amorphous and crystalline states. The amorphous state generally exhibits higher resistivity than does the crystalline state. Phase change in the phase change materials may be induced reversibly such that a given memory element may change from the amorphous state to the crystalline state and from the crystalline state to the amorphous state in response to temperature changes. Controllable heating of the phase change material, which may occur by driving a current through the phase change material or feeding a current through a resistive heater adjacent the phase change material, causes controllable phase change within the phase change material.

A phase change memory that contains a memory array having memory cells that are made of phase change material may be programmed to store data utilizing the memory states of the phase change material by controlling a current and/or voltage pulse that is applied to the phase change material, where the level of current/voltage corresponds to the temperature induced within the phase change material in each memory cell of the memory array.

In the continuing quest to reduce memory cell size for data storage applications, the memory cell layout is preferably lithography friendly during the fabrication process. However, certain materials used in the fabrication process may have certain adverse characteristics when using a dry etching process such as reactive ion etching (RIE).

SUMMARY

According to one embodiment of the present invention, a self-align metal contact for a phase control memory (PCM) element is provided that mitigates unwanted residual tantalum nitride (TaN) particles that would otherwise remain after patterning a TaN surface using an RIE process.

DETAILED DESCRIPTION

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Glossary of Terms

TaN, TiN bottom electrode—Utilizing the poor thermal and electrical conductivity of TaN we have thermally insulates the bottom electrode and thus drastically reduces the heat loss. A bottom electrode with a TaN thermal barrier or TiN conductor can be used for low reset current. The benefit of thermal insulation is understood through electrothermal simulation. The low reset current also improves the reliability and excellent cycling endurance. This low power device is promising for expanding the application for PCM.

Carbon containing capping layer (SiCNH/NBLok)—The silicon nitride or silicon carbon nitride (N-Blok) layer is commonly known as a hard mask layer or polish stop layer. At least one conductor is embedded in the ILD layer. The conductor is typically copper or a copper alloy in advanced interconnects, but alternatively may be aluminum or another conductive material. When the conductor is copper-based, a diffusion barrier liner is preferably disposed between the ILD layer and the copper-based conductor. The diffusion barrier liner is typically comprised of tantalum, titanium, tungsten, or nitrides of these metals.

tetra-ethyl-ortho-silicate (TEOS)—may be deposited by chemical vapor deposition (CVD) and can be used for etch stop layer in BEOL (back end of line) integration.

GeSbTe (GST)—Phase change memory, or PRAM, is based on a phase change material (PCM), which may be in one of two states, which, in the case of chalcogenide glass PCMs, are the amorphous and crystalline phase. The same phases are exploited in optical CD-RW and DVD-RW disk technologies. Commonly-used chalcogenide materials are germanium antimony tellerium (GeSbTe) alloys, usually referred to as "GST", and a specific current commonly-used GST is Ge2Sb2Te5, referred to herein as "GST".

Cu and W—The electrical interconnect structure for the PCM element, where the conducting line and/or vias have a metal selected from the group consisting of: Cu, Al, W, and Ag; the gate electrode has a metal selected from the group consisting of: Cu, Al, W, Ag, Er, Ni, Co, Au, Sn, poly-Si, and poly-Ge, and the source and drain contacts have a metal selected from the group consisting of: Cu, Al, W, Ag, Er, Ni, Co, Au, and Sn.

Figure 1:
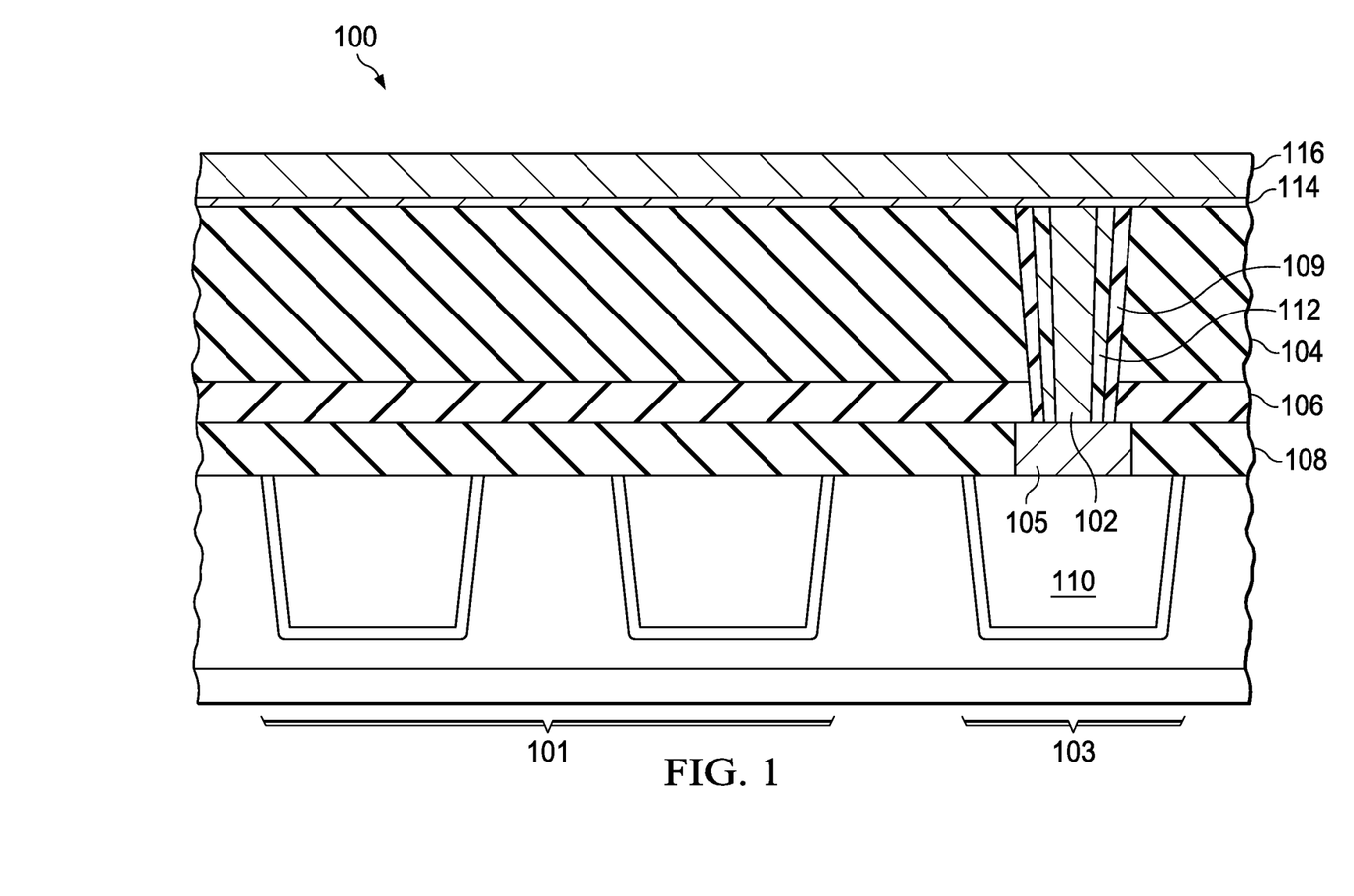
FIG. 1 is a depiction of a partially formed phase change memory (PCM) element having a layer of PVD Tantalum (Ta) and a layer of PVD Tantalum Nitride (TaN) formed after having formed a phase change memory (PCM) pore or via.

With reference to FIG. 1, there is depicted at 100 an intermediate state of a component associated with a fabrication process used to form a data storage device comprising an array of PCM elements, and includes a substrate-based POR area 101 and a PCM area 103. A representative, partially formed PCM element is shown in the PCM area 103, and has a PCM pore or via 102 extending through a layer of Low-k or tetraethoxysilane (TEOS) material 104 and through an NBLOK material 106 that is approximately 30 nm thick in a preferred embodiment, and ending at a bottom element (BE) 105 that comprises a NBLOK+TaN (or TiN) bi-layer or single TaN (or Tin) layer having a thickness ranging from 20-80 nm that has been deposited as a generally circular region approximately 20-100 nm in diameter within an approximately 20-80 nm thick SiN or NBLOK (which is an etch stop layer comprised of SiCN) material 108. The BE may be 20-80 nm wide and is formed on top of landing pad 110. The PCM pore/via 102 is contained within a channel 109 having a 3-7 nm thick ALD TaN or TiN liner 112. A 2-10 nm thick PVD Ta layer 114 is formed above the Low-K/TEOS layer 104 and extends across the top portion of the PCM pore/via 102. An approximately 20-80 nm thick PVD (or ALD, CVC) TaN layer or TiN/TaN bilayer 116 with selectivity to T-etch extends across the PVD Ta layer 114.

Figure 2:
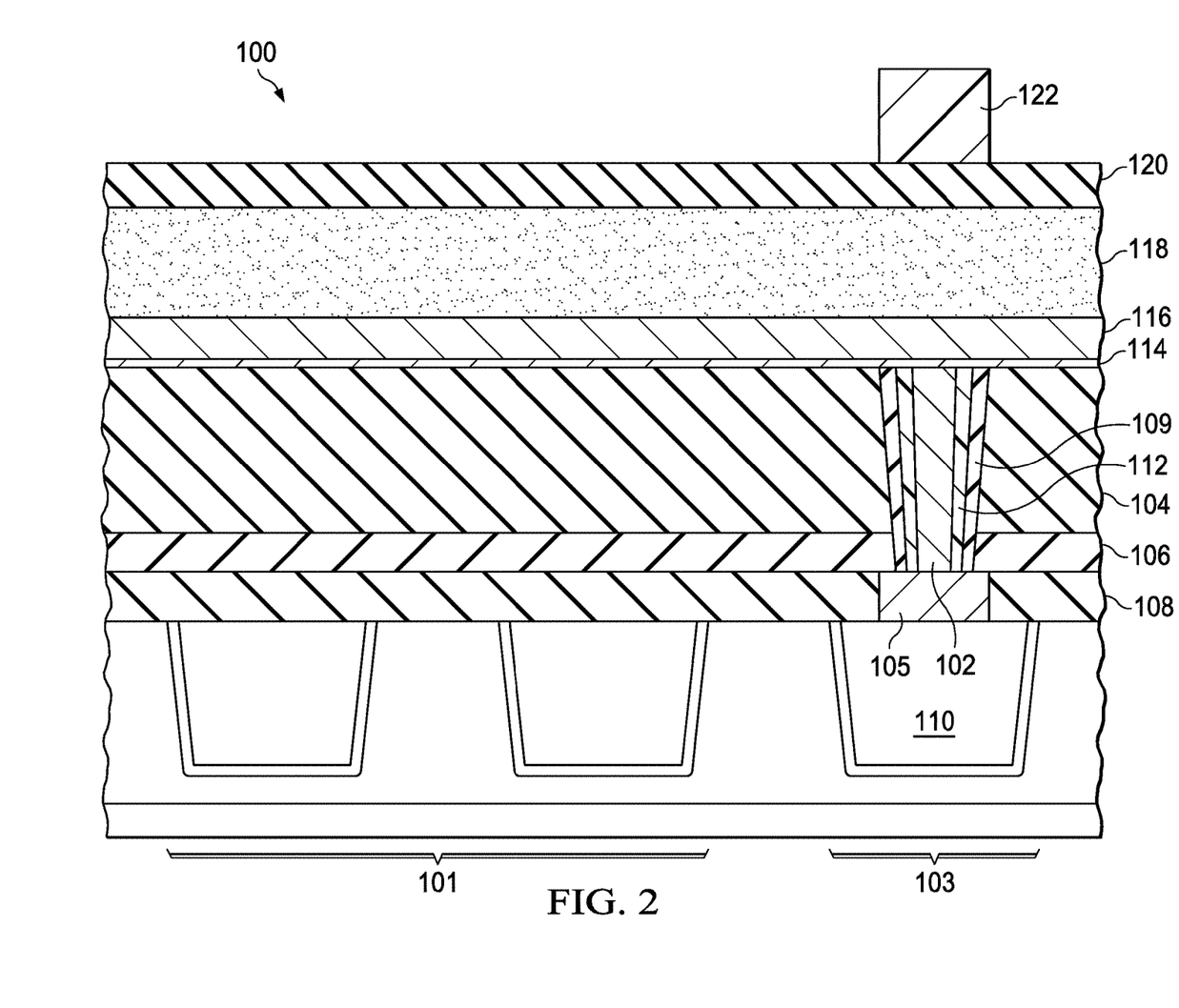
FIG. 2 is a depiction of a partially formed PCM element similar to FIG. 1, with an additional lithography (litho) stack formed above the PCM pore/via comprising an organic planarization layer (OPL), a silicon containing anti-reflective coating (SiARC) layer, and a photo-resist material.

FIG. 2 depicts the structure 100 of FIG. 1 with several elements added thereto, including an approximately 100 nm thick OPL layer 118, and approximately 35 nm thick SiARC layer 120, and an approximately 100 nm photo-resist portion 122 used as a lithographic stack to pattern certain areas of the memory device.

Figure 3A:
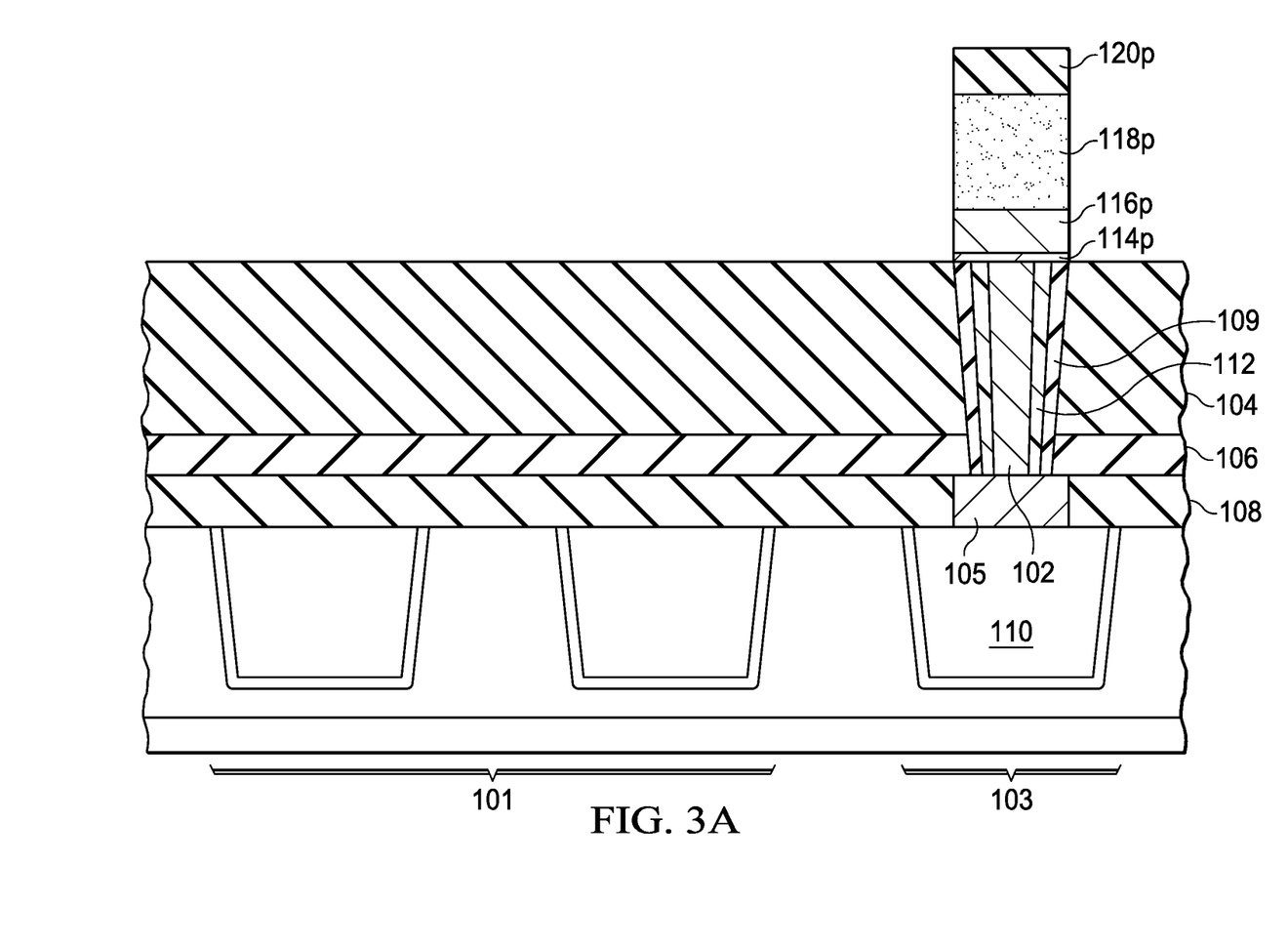
FIGS. 3A-3B depict a partially formed PCM element similar to FIG. 2, but after an etching process has been used to etch away portions of the OPL an SiARC layers of a litho stack.

FIG. 3A shows the state of the intermediate structure 100 after patterning using an RIE process that caused the portions of OPL layer 118 and SiARC layer 120 not directly underneath photo-resist portion 122 to be removed, and the portions of the OPL layer 118 and SiARC layer 120 directly underneath photo-resist portion 122 to remain as stacked portions 118p and 120p, respectively. Also removed were the portion of the PVD TaN layer 116 and the portion of the PVD Ta layer 114 not directly underneath photo-resist portion 122, leaving PVD TaN portion 116p and PVD Ta portion 114p, respectively.

Figure 3B:
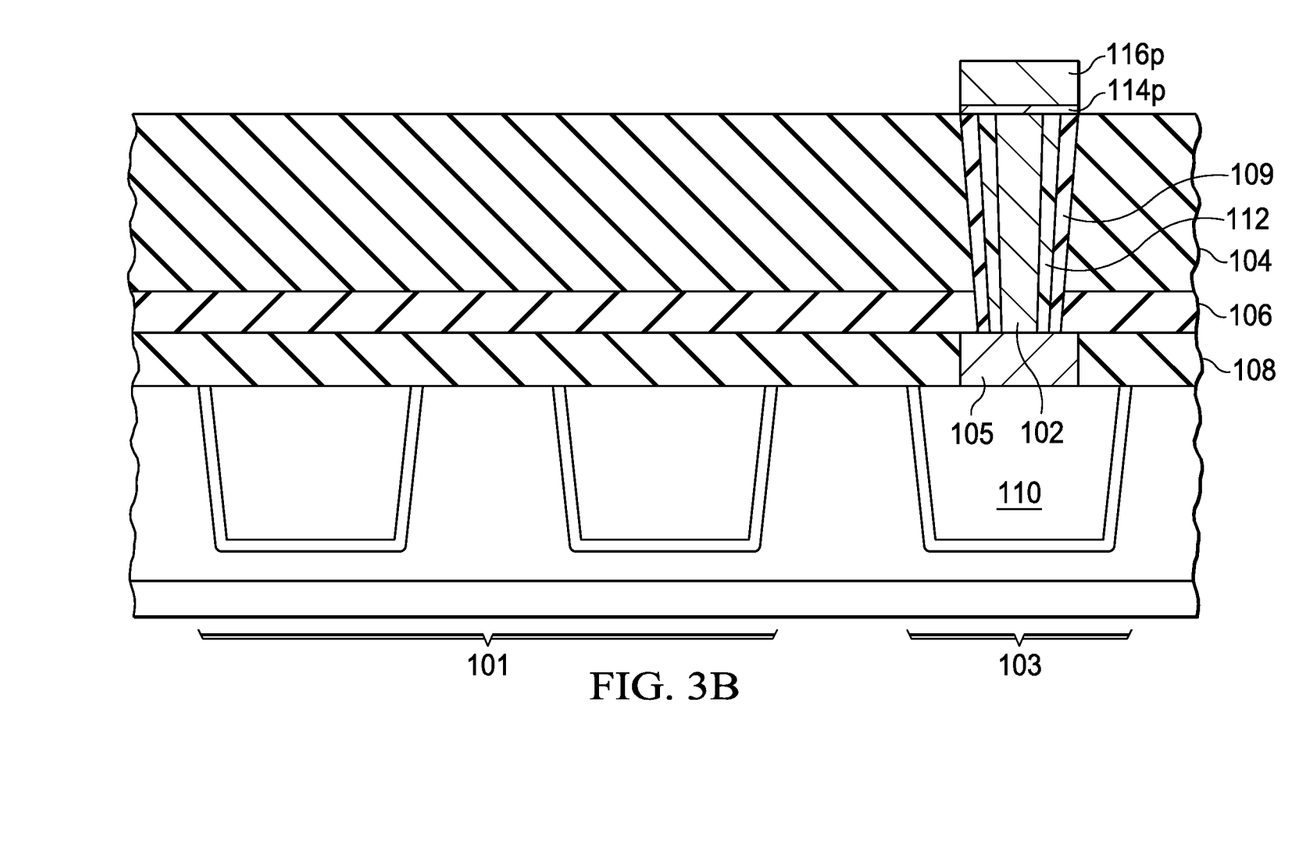
Figure 4A:
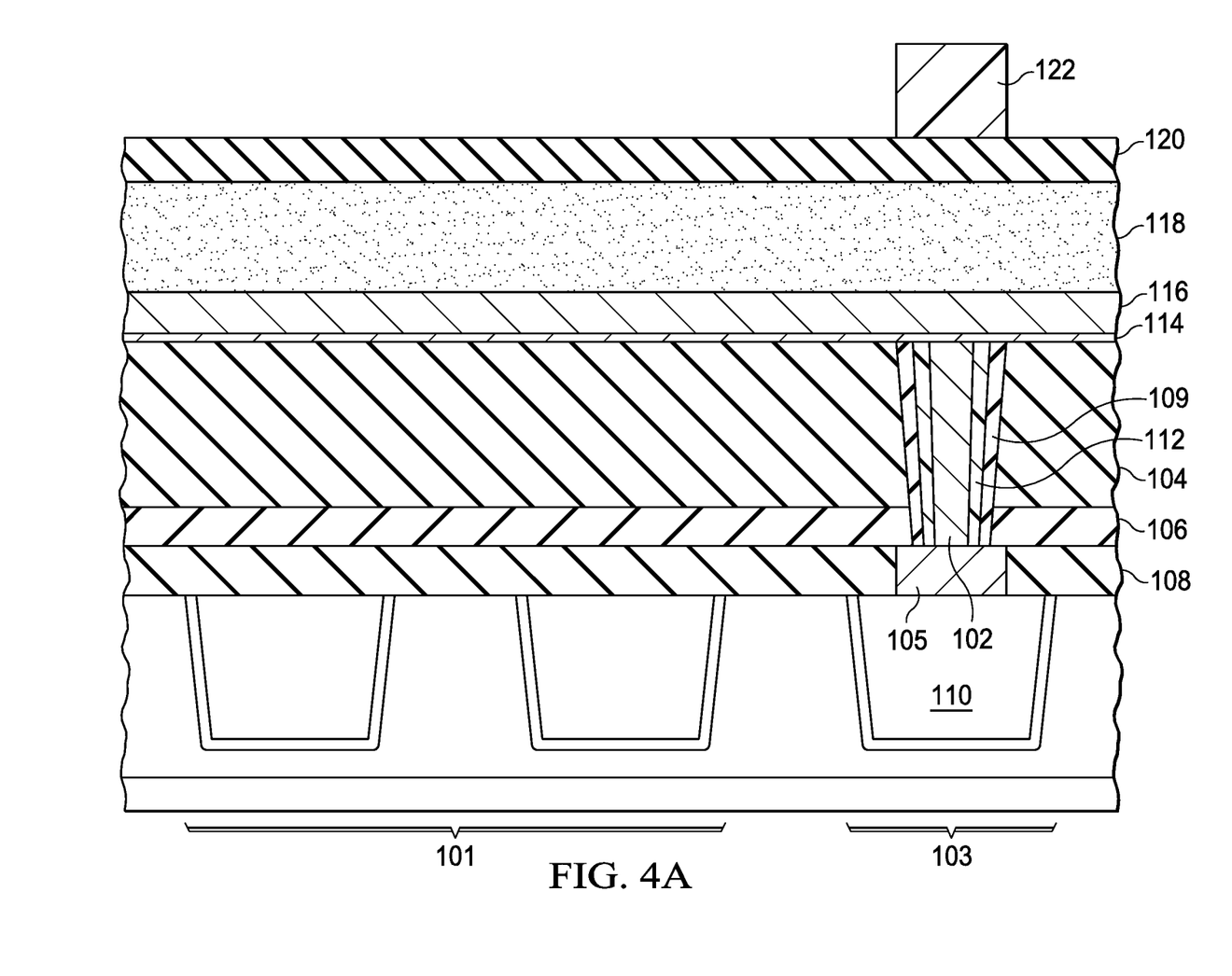
FIGS. 4A-4B depict a partially formed PCM element similar to FIG. 3, but after removing the remaining portions of the OPL and SiARC layers.
Figure 4B:
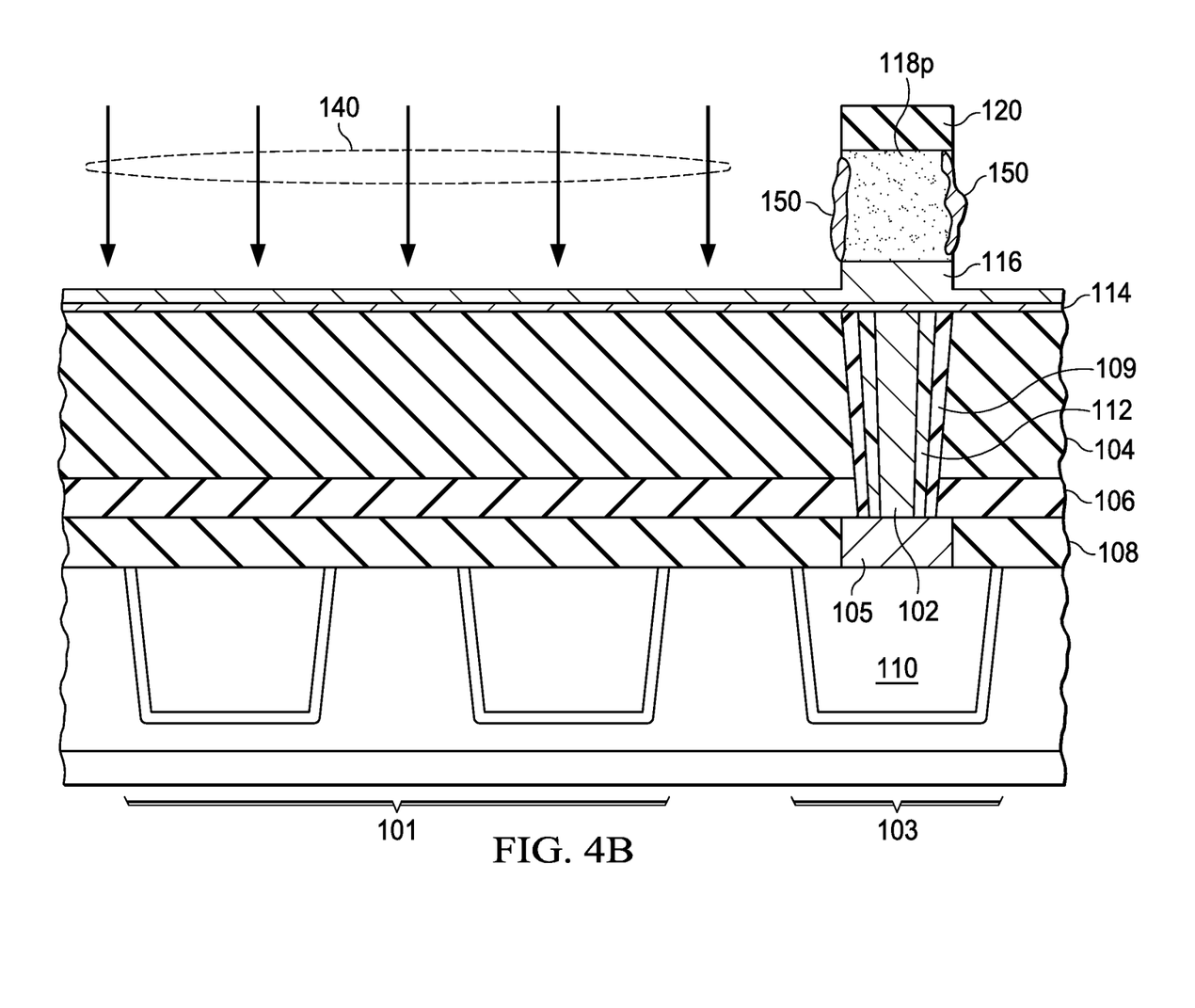

FIG. 3B shows the desired resulting structure of FIG. 3A after having removed the remaining OPL portion 118p and SiARC portion 120p. However, this desired structure is not readily achievable due to various manufacturing issues that arise when attempting to remove the remaining OPL portion 118p, as graphically depicted in FIGS. 4A and 4B. FIG. 4A essentially shows the same structure depicted in FIG. 2 where a photo-resist pattern has been patterned onto the SiARC layer 120. During the etching process, residual TaN material aversely reacts to the RIE ion bombardment shown at 140 (FIG. 4B) such that sputtered TaN sticks to the side of the OPL portion 118p as shown by sputtered TaN elements 150 of FIG. 4B, which cannot be easily removed, and therefore the desired portion 116p of FIG. 3B is not readily achievable since the residual TaN material 150 prevents all of portion 118p to be easily removed.

Figure 5:
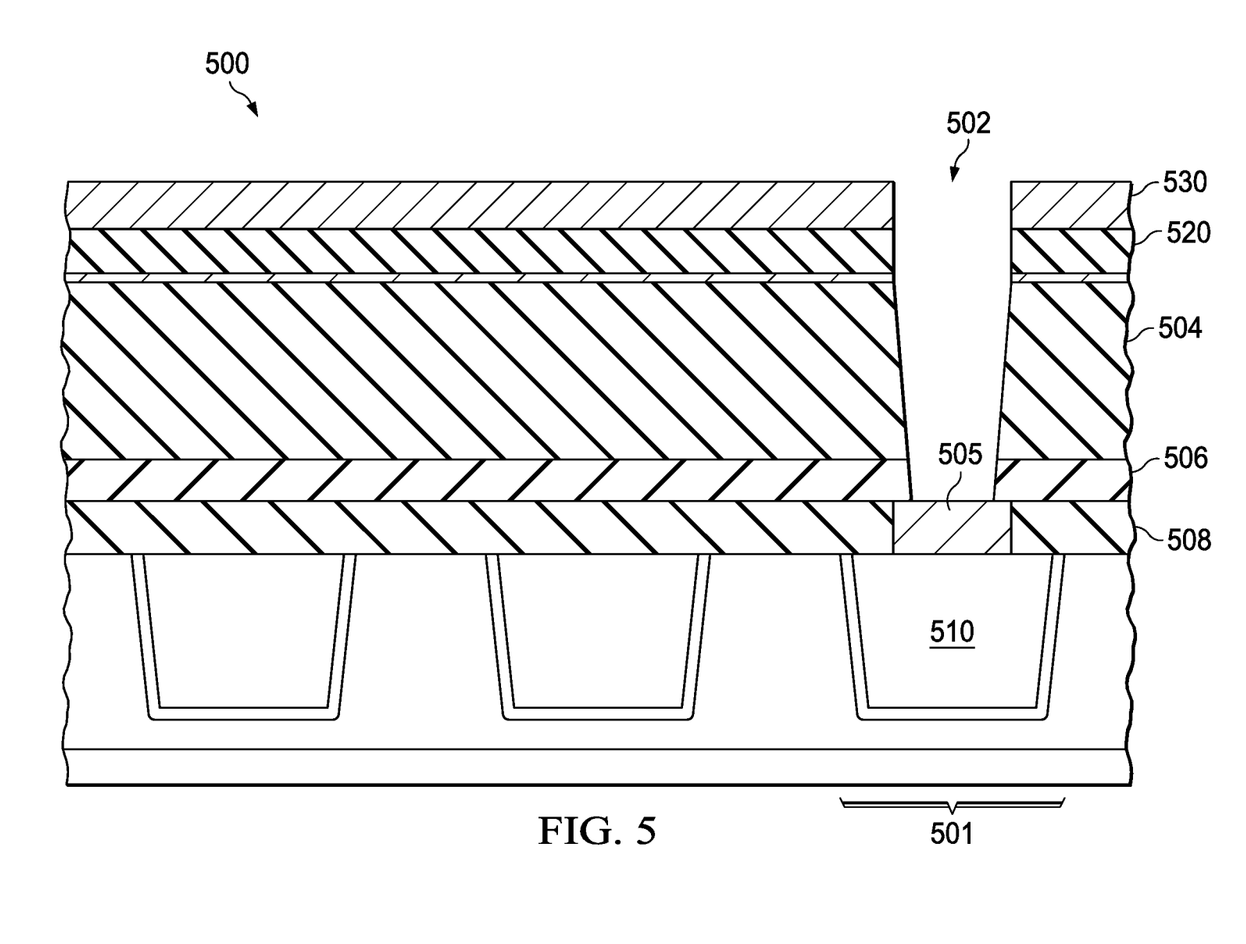
FIG. 5 depicts the PCM pore/via starting point of a process for forming PCM elements according to a preferred embodiment.

With reference to FIG. 5, there is depicted at 500 an intermediate state of a component associated with a fabrication process used to form a data storage device comprising an array of PCM elements per the preferred embodiment, where the new process begins during formation of the PCM pore/via 502. A representative, partially formed PCM element is shown in the PCM area 501, and has a PCM pore or via 502 extending through a layer of Low-k or TEOS material 504 and through an NBLOK (or SiN) material 506 that is approximately 20-80 nm thick in a preferred embodiment, and ending at a BE element 505 that, in this embodiment, comprises a TaN material having a thickness of 20 nm-80 nm that has been deposited and subjected to a CMP process which forms TaN (or TiN) within the approximately 20 nm-80 nm thick SiN (or NBLOK) material 508. The BE may be 20-80 nm wide and is formed on top of landing pad 510. A 25 nm thick SacSiN layer 520 is formed above the Low-K/TEOS layer 504. An approximately 25 nm thick TiN HM layer 530 extends across the SacSiN layer 520.

Figure 6:
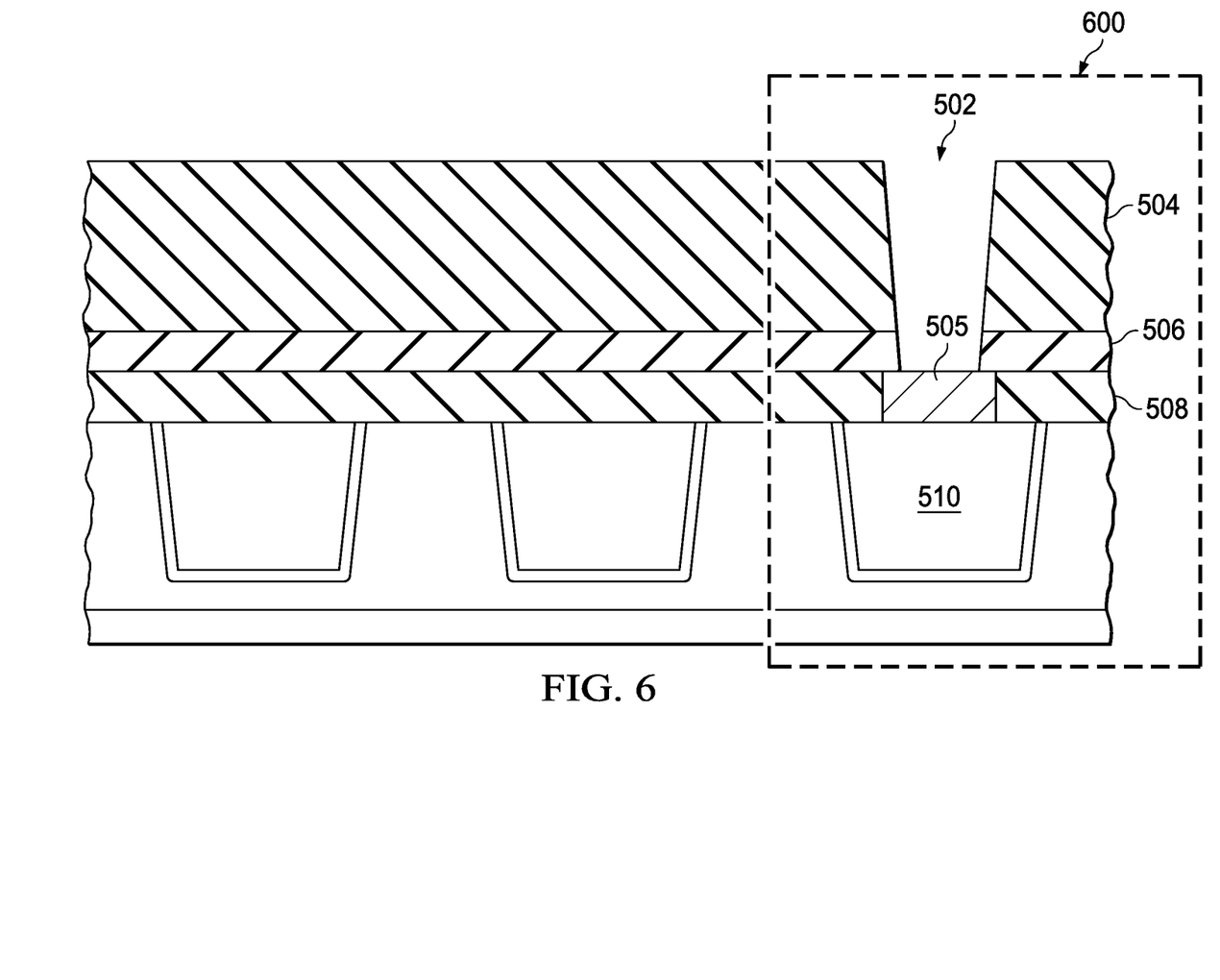
FIG. 6 depicts a highlighted region to be further depicted in FIGS. 7-11.

FIG. 6 shows the structure of FIG. 5 where, after RIE pore etching, a wet process is used to remove hard mask layers TiN 530 and SacSiN 520 that are used to protect low-k dielectric (surface) during pore RIE and following RIE ash process. TETCH removes the TiN hardmask layer 530 and DHF removes the SacSiN hardmask layer.

Figure 7:
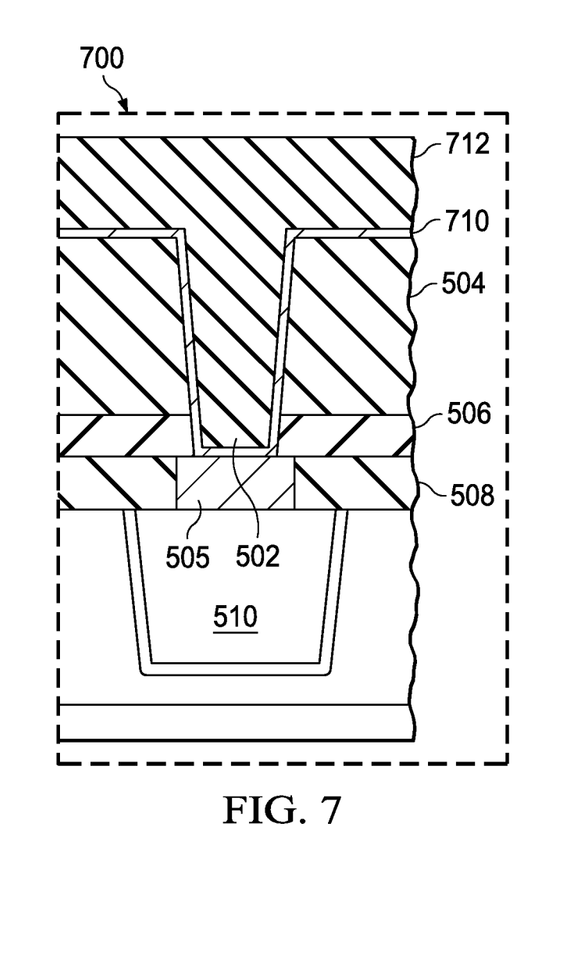
FIG. 7 depicts a metal liner and GST (GeSbTe) deposition.

The PCM area that is highlighted in FIG. 6 by the dotted rectangle 600 is shown in detail at element 700 of FIG. 7 after depositing a metal liner 710 along the surface and pore/via walls of Low-k/TEOS layer 504 and subsequent deposition of a GST (GeSbTe) layer 712 that overlays the metal liner 710 and fills in the pore/via 502 defined by the metal liner 710 deposited on the pore/via walls of Low-k/TEOS layer 504. The GST layer 712 is deposited by ALD, CVD, or PVD process.

Figure 8:
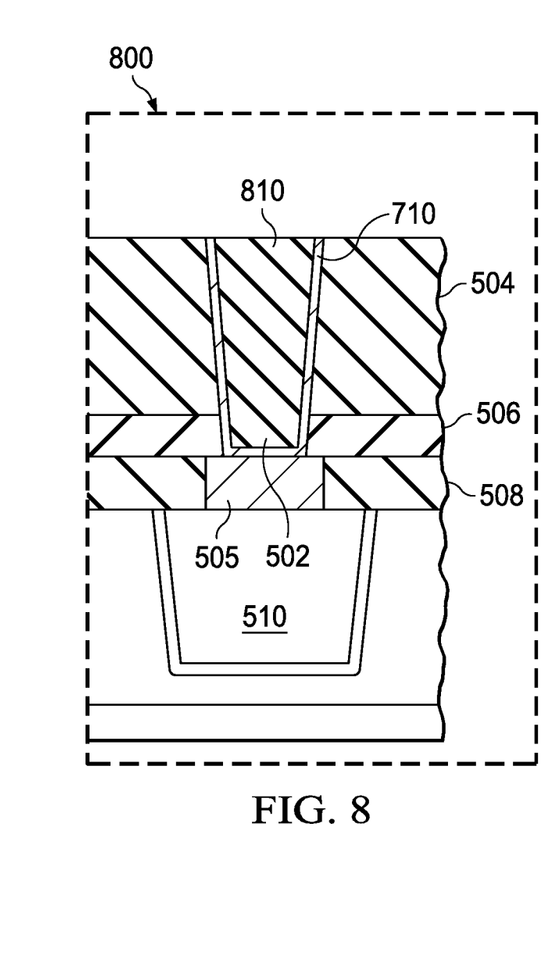
FIG. 8 depicts GST CMP stopping on Low-k (field oxide)

Next, and as depicted at 800 in FIG. 8, the result of a GST CMP processing step is shown. CMP is used to remove all GST 712 on top of Low-k/TEOS layer 504 and above via 502 that extends above the top surface of Low-k/TEOS layer 504, and to remove the portion of metal liner 710 on the top surface of Low-k/TEOS layer 504. The GST material is therefore advantageously confined, as shown by element 810, within the pore/via area 502 after the GST CMP processing step.

Figure 9:
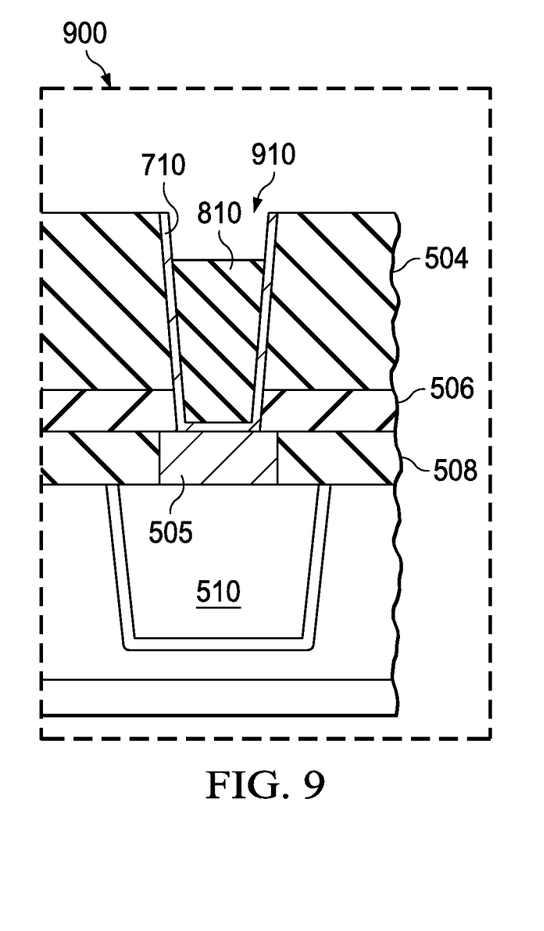
FIG. 9 depicts a GST recess.

Next, and as depicted at 900 in FIG. 9, the result of a GST recess processing step is shown. RIE (Reactive-ion etching) or selective WET process is used to remove part of the top GST in via/pore 502, as depicted by element 910.

Figure 10:
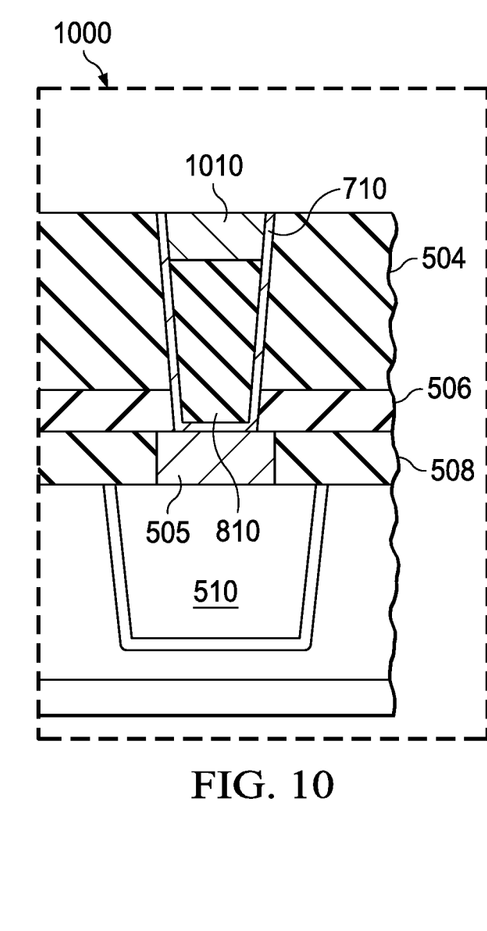
FIG. 10 depicts a top electrode metal deposition and CMP.

Next, and as depicted at 1000 in FIG. 10, the result of a top electrode metal deposition and CMP processing step is shown at 1010. 20 nm-100 nm of TaN (or TiN, W, etc.) metal is deposited and then CMP polish down to TEOS (Low-k) 504.

Figure 11:
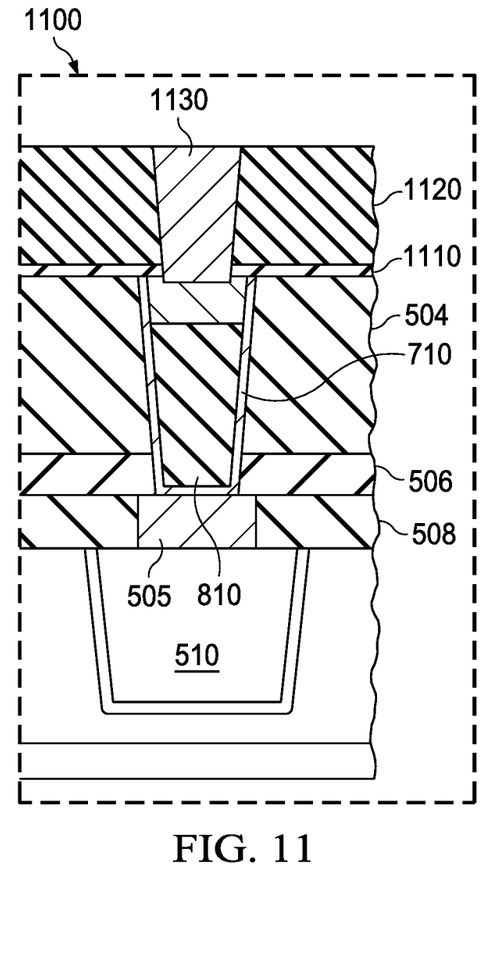
FIG. 11 depicts a contact.

Next, and as depicted at 1100 in FIG. 11, the result of a contact formation processing step is shown. After 10-50 nm of NBLOK capping deposition at 1110, 40-120 nm of Low-k (TEOS) is deposited at 1120. Metal patterning open metal via filled with W or Cu and CMP to polish down to low-k (TEOS) layer 1120 to form a self-aligned next contact level 1130.

Thus, illustrative embodiments of the present invention provide a self-align metal contact for a phase control memory (PCM) element that mitigates unwanted residual tantalum nitride (TaN) particles that would otherwise remain after patterning a TaN surface using an RIE process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array comprising a plurality of phase change memory elements, wherein at least one of the plurality of phase change memory elements comprises:
   a bottom element coupled to a landing pad of the at least one of the plurality of phase change memory elements;
   a GeSbTe portion coupled to the bottom element, wherein the GeSbTe portion is fully formed within a via extending from and above the bottom element, and wherein the via is directly coated with a metal liner and extends through a layer of low-k dielectric material and through an NBLOK material;
   a top electrode metal coupled to the GeSbTe portion;
   an NBLOK capping layer extending at least partially over the layer of low-k dielectric material;
   another layer of low-k dielectric material extending at least partially over the NBLOK capping layer; and
   a self-aligned metal contact coupled to the top electrode metal and extending through the another layer of low-k dielectric material and through the NBLOK capping layer and penetrating into the top electrode metal.

2. The at least one of the plurality of phase change memory elements of claim 1, wherein the bottom element is formed from a TaN material or a TiN material.

3. The at least one of the plurality of phase change memory elements of claim 2, wherein the bottom element further comprises another NBLOK material to form a bi-layer in the bottom element.

4. The at least one of the plurality of phase change memory elements of claim 1, wherein the top electrode metal is formed from a TaN material or a TiN material.

5. The at least one of the plurality of phase change memory elements of claim 1, wherein the self-aligned metal contact is formed from one of copper (Cu) or tungsten (W).

6. The at least one of the plurality of phase change memory elements of claim 1, wherein the top electrode metal is fully formed within the via.

7. The at least one of the plurality of phase change memory elements of claim 1, wherein the NBLOK capping layer is above the GeSbTe portion in the via.

8. The at least one of the plurality of phase change memory elements of claim 1, wherein the another layer of low-k dielectric material is above the GeSbTe portion in the via.

9. The at least one of the plurality of phase change memory elements of claim 8, wherein the NBLOK capping layer is above the GeSbTe portion in the via.

10. The at least one of the plurality of phase change memory element of claim 1, wherein the via is directly coated with a metal liner along sidewalls and a bottom surface of the via.

* * * * *